INTEGRATED SEMICONDUCTOR LOGIC CIRCUITS

Filed Aug. 27, 1964

INVENTOR.
JOSEPH R. BURNS &
ROBERT A. POWLUS
BY John V. Regan
ATTORNEY

United States Patent Office 3,328,604
Patented June 27, 1967

3,328,604
INTEGRATED SEMICONDUCTOR LOGIC CIRCUITS
Joseph R. Burns, Trenton, N.J., and Robert A. Powlus, Yardley, Pa., assignors to Radio Corporation of America, a corporation of Delaware
Filed Aug. 27, 1964, Ser. No. 392,440
5 Claims. (Cl. 307—88.5)

This invention relates to semiconductor circuits, and more particularly to integrated semiconductor logic circuits.

It is desirable to be able to manufacture semiconductor logic circuits in integrated form because, when a large number of logic circuits are to be manufactured, there is a considerable saving in time, space and cost when integrated fabrication techniques are utilized. In its simplest form, one individual integrated logic circuit may consist of an active circuit element, such as an MOS (metal oxide semiconductor) transistor, and a load impedance, such as a linear resistor, fabricated together on a substrate. A large number of such logic circuits may be readily formed on a single substrate wafer and interconnected as desired. Such logic circuits may exhibit an output signal of one level when a binary "1" is to be represented and an output signal of another level when a binary "0" is to be represented.

When a group of integrated semiconductor circuits are interconnected to form a system or subsystem, the leakage currents flowing through the transistors therein may cause voltage drops in the load resistors for the transistors. Such voltage drops may cause the output signals to shift from their desired binary levels. Such a shifting tends to be cumulative and may result in an incorrect output at some stage in the system or subsystem.

Accordingly, it is an object of this invention to provide a new and improved integrated semiconductor circuit which avoids the use of linear load resistors.

It is another object of this invention to provide an improved load impedance for integrated logic circuits.

It is still another object of this invention to provide a nonlinear load impedance for use in an integrated circuit.

A nonlinear impedance in accordance with the invention includes an insulated gate, field-effect transistor formed on a substrate. The transistor has first and second electrodes separated by a conductive channel and a control electrode adjacent to but insulated from said channel for controlling the conductance of the channel. A photovoltaic device, which converts radiant energy into electrical energy, is formed on the substrate between the control electrode and the first electrode of the transistor to bias the transistor to exhibit a nonlinear conductance characteristic.

In an integrated logic circuit, according to the invention, a second insulated gate, field-effect transistor is formed on the same substrate with the aforementioned first transistor and photovoltaic device. The channels of two transistors are serially connected so that the combination of the first transistor and the photovoltaic device comprises a non-linear impedance load on the second transistor. An energizing source is coupled across the series combination of transistors. An input signal is applied to the gate electrode of the second transistor and an inverted output signal is derived from the junction of the two transistors.

Accordingly, it is a further object of this invention to provide an integrated logic circuit including a nonlinear impedance which is fabricated on the same substrate as an active transistor element.

Figure 1:
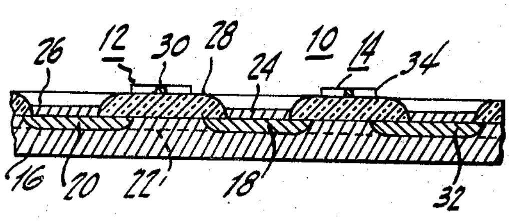
FIGURE 1 is a cross-sectional elevational view taken along the line 1—1 of an integrated semiconductor circuit as shown in FIGURE 2.
Figure 2:
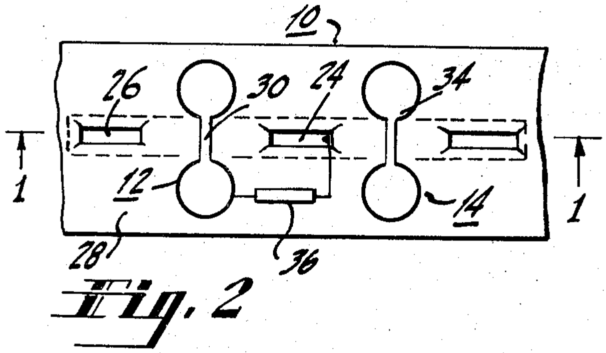
FIGURE 2 is a plan view of the circuit of FIGURE 1 with the addition of a cadmium telluride photovoltaic device.

Referring now to FIGURES 1 and 2, a portion of an integrated circuit wafer 10 includes a pair of enhancement type MOS (metal oxide semiconductor) transistors 12 and 14 formed on a substrate 16. The substrate 16 may, for example, be made of semiconductor material such as P-type silicon and MOS transistors 12 and 14 of N-type conductivity are formed thereon. For convenience, only two transistors are shown on the wafer 10 even though a large number of transistors would be fabricated at the same time. The first transistor 12 includes drain 18 and source 20 electrodes of N-type conductivity. The electrodes 18 and 20 are diffused on the substrate 16 in spaced relation to each other so as to define a conductive channel 22 therebetween. A layer of insulating material 28 is formed over the substrate 16 and the electrodes 18 and 20. The insulating material 28 which may, for example, comprise a metallic oxide, is etched away above the electrodes 18 and 20 and metal terminals 24 and 26 are evaporated on the electrodes 18 and 20, respectively, to provide connections therefrom. A metallic gate electrode 30 is evaporated on the insulator 28 to provide a control electrode which controls by potential field effects the conductance of the channel 22 of the transistor 12. The source electrode 18 of the transistor 12 also comprises the drain electrode of the transistor 14. Thus, the transistors 12 and 14 each share one electrode 18. The transistor 14 is otherwise fabricated identically to the transistor 12 and also includes source and gate electrodes 32 and 34, respectively.

MOS transistors have been described in an article entitled "The Silicon Insulated-Gate, Field-Effect Transistor" by S. Hofstein et al. appearing in the September 1963 Proceedings of The IEEE beginning on page 1190. Thin film transistors may be used instead of the MOS transistors in practicing the invention. For example, a thin film transistor of the type described in the article entitled "The TFT—A New Thin-Film Transistor Network" by P. K. Weimer in the June 1962 Proceedings of the IRE beginning on page 1462 may be used. Even though either MOS or TFT transistors may be utilized, the specification will refer only to MOS transistors for convenience.

In FIGURE 2 there is shown a plan view of the integrated circuit 10 of FIGURE 1. Also shown in this view is a photovoltaic device 36 which is deposited on the insulating layer 28 above the substrate 16. The device 36 is deposited between the gate electrode 30 and the metal terminal 24 for the source electrode 18 of the transistor 12. The photovoltaic device 36 is deposited on the circuit wafer 10 by evaporation techniques. In depositing the device 36, the wafer 10 is mounted with its upper major face (upper in FIGURE 1 and the face viewed in FIGURE 2) at a non-zero angle to the horizontal in a vacuum chamber. Below the wafer 10 a crucible containing cadmium telluride is heated until evaporation occurs. The wafer 10 is suitably masked so that the cadmium telluride is deposited in a film between the gate 30 and the terminal 24 for the source 18 electrode. Gold connections may be utilized to complete the connection of the photovoltaic film 36 to these electrodes.

A cadmium telluride film functions as a photovoltaic cell which produces a voltage when radiant energy, such as light, is directed onto the film. During deposition, the wafer 10 is inclined at an angle such that the gate 30 is further away from the crucible than the terminal 24. This inclination insures that the film 36 will develop a voltage which is more positive at the end of the film 36 connected to the gate 30 than the end connected to the terminal 24. The voltage produced in the cadmium telluride film for a given intensity of illumination is directly proportional to the length of the deposited film. Thus, the longer the film, the greater the voltage produced for any given intensity of light. Additionally, a greater voltage is also produced for a greater intensity of light. In some circuit operations the light may, for example, consist solely of ambient light. Cadmium telluride photovoltaic devices are described more fully in Patent No. 2,915,578, Photovoltaic Device, which is assigned to the assignee of the present application.

Figure 3:
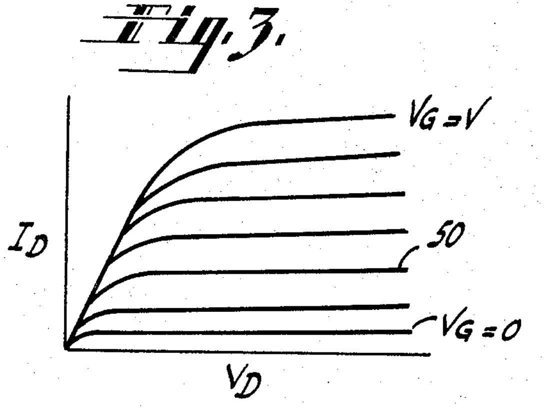
FIGURE 3 is a current voltage characteristic of an enhancement type insulated gate, field-effect transistor.

An enhancement type MOS transistor of N-type conductivity such as the transistor 14 exhibits a current-voltage characteristic as shown in FIGURE 3. In such transistors the current flows in the channel between the drain and source electrodes without crossing a rectifying junction. For a low or zero gate bias voltage, a small leakage current flows when a drain voltage energizes the transistor. This current is shown for $V_{G=O}$ in FIGURE 3. For increasing positive values of gate bias voltage $V_G$, the current flow increases for a given drain voltage $V_D$. The transistor 12 with the photovoltaic device 36 connected thereto such that the gate 30 is more positive than the source 18 may exhibit a current-voltage characteristic such as that illustrated by the curve 50. It is to be noted that the curve 50 may also be produced by biasing the gate 30 by a battery of the proper voltage value. The photovoltaic device 36 obviates the necessity of utilizing such a bias battery to obtain the same results. The curve 50 may be identical to the characteristic curve of a depletion type MOS transistor with zero gate bias. However, such a depletion type transistor cannot be fabricated on the wafer 10 with an enhancement type transistor with the same ease that a cadmium telluride film can be deposited on this wafer. The cadimum telluride film therefore exhibits advantages over such alternative circuits when an integrated circuit is desired.

Figure 4:
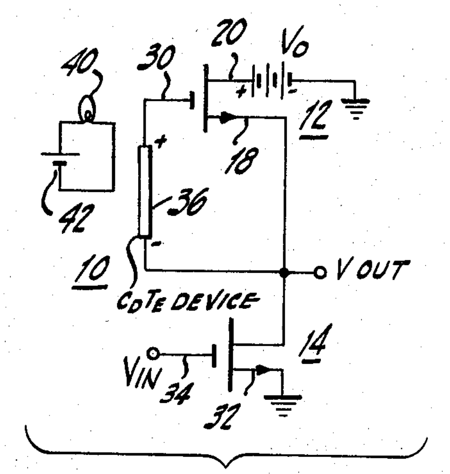
FIGURE 4 is a schematic circuit diagram of an integrated semiconductor logic circuit; and, FIGURE 5 is a graph which is helpful in explaining the operation of the circuit of FIGURE 4.

Referring now to FIGURE 4, a schematic circuit diagram of the logic circuit 10 is shown. The logic circuit 10 includes the transistors 12 and 14 serially connected between circuit ground and a power supply $V_0$. The power supply $V_0$ is connected across the serial combination by connecting the positive terminal thereof to the drain electrode 20 of the transistor 12 and the negative terminal thereof to circuit ground along with the source electrode 32 of the transistor 14. Ground in an integrated circuit such as 10 may be the substrate 16. The cadmium telluride photovoltaic film 36 is deposited between the gate electrode 30 of the transistor 12 and the drain-source electrode 18 which is common to both transistors 12 and 14. Input signals $V_{in}$ of either "0" or $V_0$ voltage levels are applied to the input or gate electrode 34 of the transistor 32, and output signals $V_{out}$ are derived from the drain electrode of the transistor 14 which is the common electrode 18. A lamp 40, which is energized by a battery 42, is provided to cause the transistor 12 to exhibit the characteristic curve 50 as shown in FIGURE 3. A cadmium telluride film such as 36 exhibits an impedance on the order of $10^{10}$ ohms. Such a high impedance is a disadvantage in most circuits because a much lower impedance shunted across the device 36 effectively shorts out the device 36. However, the input impedance of an MOS transistor is on the order of $10^{15}$ ohms. Such an impedance permits substantially the full open circuit voltage of the cadmium telluride film to be developed in the circuit 10.

Figure 5:
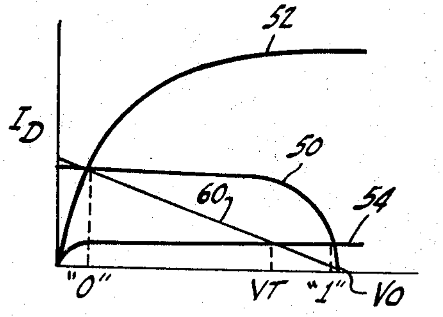

The logic circuit 10 functions as an inverter circuit in that a binary "1" input signal (i.e., a voltage of value $V_0$) causes a binary "0" output signal (i.e., a voltage of substantially zero) to be derived from the output terminal, and vice versa. In FIGURE 5 there are illustrated curves which aid in understanding the operation of this circuit. In this graph the curve 52 is the current-voltage characteristic exhibited by the transistor 14, when a binary "1" input signal forward biases this transistor. The characteristic of the transistor 14 for a binary "0" input signal, i.e., zero gate bias, is illustrated by the curve 54. The curve 50 is the composite characteristic curve of the combination of the transistor 12 and photovoltaic device 36 operated at a constant bias by the constant light source 40 illuminating the device 36. The curve 50 is drawn opposite to the curves 52 and 54 to denote that the transistor 12-device 36 combination may be considered to function as a load on the transistor 14.

When a binary "0" input signal is applied to the circuit 10, the output voltage $V_{out}$ is substantially equal to the supply voltage $V_0$, as shown by the intersections of the curves 50 and 54. With such a binary "0" input signal, the transistor 14 exhibits a large impedance so most of the supply voltage $V_0$ is developed across this transistor 14. When a binary "1" input signal is applied to the circuit 10, the output signal is a binary "0," i.e., substantially zero, as shown by the intersection of the curves 50 and 52 in FIGURE 5. Thus, the circuit 10 functions as an inverter.

The advantages obtained from providing a nonlinear load impedance over a linear load resistor is evident from the curves in FIGURE 5. The leakage or zero gate bias current flowing in the transistor 14, as represented by the curve 54 in FIGURE 5, may vary appreciably when utilizing a nonlinear load impedance (curve 50) but the output voltage $V_{out}$ still remains substantially constant. This is due to the fact that the curve 50 is nearly vertical near the intersection of the curves 50 and 54. Thus, undesirable voltage changes (noise signals) in the circuit are minimized. The curve 60, which represents a linear resistive load on the transistor 14, is more horizontal in slope than the curve 54. Because of this slope, the output voltage $V_T$ for a linear load resistor will fluctuate appreciably with changes in leakage current. Furthermore, the output voltage $V_T$ differs appreciably from the supply voltage $V_0$ even with no current fluctuations. Therefore, the voltage $V_T$ is unequal to a binary "1." This is caused by the linear slope of the linear load resistor. A linear resistive load also slows down the repetition rate of the circuit 10.

Thus, in accordance with the invention, a nonlinear impedance device is formed by depositing a photovoltaic device such as a cadmium telluride film between the gate and drain electrodes of an MOS enhancement type transistor. The combination provides a nonlinear conductance which is utilized as a nonlinear load on another enhancement type trnasistor fabricated on the same wafer with the first transistor. A large number of such circuits can be integrated on a single wafer to reduce the size, time and cost of manufacturing the plurality of circuits.

What is claimed is:

1. A nonlinear device comprising in combination, an enhancement type insulated gate, field-effect transistor formed on a semiconductor substrate and including first and second electrodes spaced from each other to define a conductive channel therebetween and a control electrode insulated from said channel and controlling by a potential field the conductance of said channel, and a cadmium telluride photovoltaic device formed between said gate and first electrodes to exhibit a potential field when illuminated and bias said transistor to exhibit a nonlinear conductance characteristic between said first and second electrodes.

2. A nonlinear device comprising in combination, a pair of insulated gate, field-effect transistors serially formed on a semiconductor substrate with each including first and second electrodes spaced from each other to define a conductive channel therebetween and a control electrode insulated from said channel and controlling by a potential field the conductance of said channel, and a cadmium telluride photovoltaic device formed between the gate and first electrodes of one of said transistors to exhibit a potential field when illuminated and bias said one transistor to exhibit a nonlinear conductance characteristic between said first and second electrodes thereof.

3. An integrated circuit comprising in combination, a first insulated gate, field-effect transistor formed on a substrate and including first and second electrodes separated by a channel which defines a conductive path for said first transistor and a control electrode adjacent but insulated from said channel for controlling by a potential field the conductance of said channel, a photovoltaic device formed on said substrate between the gate and first electrodes of said first transistor to exhibit a potential field when activated to bias said first transistor to exhibit a nonlinear conductance between said first and second electrodes thereof, a second insulated gate, field-effect transistor formed on said substrate and including first and second electrodes separated by a second conductive channel, and a control electrode adjacent but insulated from said second conductive channel for controlling by a potential field the conductance of said second conductive channel, means for applying an input signal to said control electrode of said second transistor, and means for deriving an output signal from said second electrode of said second transistor.

4. An integrated circuit comprising in combination, a substrate of semiconductor material, a first insulated gate, field-effect transistor formed on said substrate and including drain and source electrodes separated by a conductive channel and a gate electrode adjacent but insulated from said conductive channel for controlling by a potential field the conductance of said conductive channel, a cadmium telluride film formed between said gate and source electrodes of said first transistor to exhibit a potential field when activated by radiant energy to bias said first transistor to exhibit a nonlinear conductance between said drain and source electrode, a second insulated gate, field-effect transistor formed on said substrate and including an electrode common with said source electrode of said first transistor and a source electrode separated from said common electrode to define a second conductive channel and a gate electrode adjacent but insulated from said second conductive channel for controlling by a potential field the conductance of said second conductive channel, means for applying an input signal to said gate electrode of said second transistor, and means for deriving an inverted output signal from said common electrdoe of said transistors.

5. An integrated logic circuit comprising in combination, a substrate of semiconductor material having a planar surface, a first enhancement type insulated gate, field-effect transistor formed on said planar surfaces of said substrate and including drain and source electrodes separated by a conductive channel and a gate electrode adjacent but insulated from said conductive channel for controlling by a potential field the conductance of said conductive channel, a cadmium telluride film deposited at an angle to said planar surface on said substrate and between said gate and source electrodes of said first transistor to exhibit a potential field when illuminated to bias said first transistor to exhibit a nonlinear conductance between said drain and source electrodes, a second enhancement type insulated gate, field-effect transistor formed on said planar surface of said substrate and including a drain electrode common with the source electrode of said first transistor and a source electrode separated from said common drain-source electrode for defining a conductive channel therebetween and a gate electrode adjacent but insulated from said conductive channel for controlling by a potential field the conductance of said channel, means coupled between said source electrode of said second transistor and said drain electrode of said first transistor for energizing said logic circuit, means for applying an input signal to said gate electrode of said second transistor, and means for deriving an inverted output signal from said common electrode of said transistors.

References Cited

UNITED STATES PATENTS

| | | | |
|---|---|---|---|
| 3,209,154 | 9/1965 | Maring | 307—88.5 |
| 3,278,853 | 10/1965 | Lin | 317—235 |

OTHER REFERENCES

L. W. Atwood: "Field Effect Transistor Circuits," IBM Technical Disclosure Bulletin, vol. 6, No. 9, February 1964, pp. 91–93.

M. S. Axelrod: "Speed-Up Circuit for NOR Circuits Using Insulated-Gate, Field-Effect Transistors," IBM Technical Disclosure Bulletin, vol. 7, No. 2, July 1964, pp. 168–169.

JOHN W. HUCKERT, *Primary Examiner.*

D. O. KRAFT, J. D. CRAIG, *Assistant Examiners.*